(12) United States Patent
Tsutsumi

(10) Patent No.: US 10,256,791 B2
(45) Date of Patent: Apr. 9, 2019

(54) RESONANT CIRCUIT, FILTER CIRCUIT, AND ACOUSTIC WAVE RESONATOR

(71) Applicant: TAIYO YUDEN CO., LTD., Tokyo (JP)

(72) Inventor: Jun Tsutsumi, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 0 days.

(21) Appl. No.: 15/335,117

(22) Filed: Oct. 26, 2016

(65) Prior Publication Data

US 2017/0214389 A1    Jul. 27, 2017

(30) Foreign Application Priority Data

Jan. 27, 2016  (JP) ................. 2016-013872

(51) Int. Cl.
*H03H 9/17*    (2006.01)
*H03H 9/54*    (2006.01)

(52) U.S. Cl.
CPC ............ *H03H 9/542* (2013.01); *H03H 9/171* (2013.01)

(58) Field of Classification Search
CPC ........... H03H 9/54–9/6489; H03H 9/70–9/725
USPC .................. 333/186–196; 310/313 R–313 D
See application file for complete search history.

(56) References Cited

U.S. PATENT DOCUMENTS

| | | | | |
|---|---|---|---|---|
| 3,831,116 A | * | 8/1974 | Davis, Jr. ................. | H03H 9/42 330/5.5 |
| 6,737,930 B2 | * | 5/2004 | Toncich ............. | G01R 27/2694 257/595 |
| 9,705,473 B2 | * | 7/2017 | David .................... | H03H 9/542 |
| 2010/0109801 A1 | | 5/2010 | Inoue et al. | |
| 2010/0291946 A1 | | 11/2010 | Yamakawa et al. | |
| 2012/0286895 A1 | | 11/2012 | Hara et al. | |
| 2012/0313731 A1 | | 12/2012 | Burgener et al. | |
| 2016/0352310 A1 | | 12/2016 | Tani et al. | |

FOREIGN PATENT DOCUMENTS

| | | |
|---|---|---|
| JP | 2004-072549 A | 3/2004 |
| JP | 2010-109894 A | 5/2010 |
| JP | 2010-206843 A | 9/2010 |
| JP | 2012-239039 A | 12/2012 |
| JP | 2014-502803 A | 2/2014 |
| WO | 2009/072251 A1 | 6/2009 |
| WO | 2012/114930 A1 | 8/2012 |
| WO | 2013/073472 A1 | 5/2013 |
| WO | 2015/119176 A1 | 8/2015 |

OTHER PUBLICATIONS

Japanese Office Action dated Jun. 19, 2018, in a counterpart Japanese patent application No. 2016-013872. (A machine translation (not reviewed for accuracy) attached.).
Japanese Office Action dated Apr. 3, 2018, in a counterpart Japanese patent application No. 2016-013872. (A machine translation (not reviewed for accuracy) attached.).

* cited by examiner

*Primary Examiner* — Dean O Takaoka
*Assistant Examiner* — Alan Wong
(74) *Attorney, Agent, or Firm* — Chen Yoshimura LLP

(57) ABSTRACT

A resonant circuit includes: a capacitor of which a capacitance is variable; and an acoustic wave resonator to which the capacitor is connected in series and/or in parallel, a capacitance of the acoustic wave resonator being to be changed so that a change in input impedance and/or output impedance is reduced when the capacitance of the capacitor is changed.

10 Claims, 19 Drawing Sheets

RESONANT CIRCUIT, FILTER CIRCUIT, AND ACOUSTIC WAVE RESONATOR

CROSS-REFERENCE TO RELATED APPLICATION

This application is based upon and claims the benefit of priority of the prior Japanese Patent Application No. 2016-013872, filed on Jan. 27, 2016, the entire contents of which are incorporated herein by reference.

FIELD

A certain aspect of the present invention relates to a resonant circuit, a filter circuit, and an acoustic wave resonator.

BACKGROUND

Mobile communication devices typified by smartphones and mobile phones have been sophisticated. For example, the transition from 3G systems to LTE (Long Term Evolution) has rapidly progressed. In LTE, a single terminal needs to support a large number of frequency bands.

International Publication Nos. 2013/073472 and 2012/114930 and Japanese Patent Application Publication Nos. 2014-502803 and 2004-072549 (Patent Documents 1 through 4) disclose filters capable of changing the frequency and the bandwidth. U.S. Pat. No. 3,831,116 (Patent Document 5) discloses a filter in which a switch is located in an Interdigital Transducer (IDT).

The techniques disclosed in Patent Documents 1 through 4 change the frequency characteristics of the filter by adding an electrostatic capacitance in series or parallel to a resonator. However, the addition of the electrostatic capacitance changes the impedance characteristic.

SUMMARY OF THE INVENTION

According to a first aspect of the present invention, there is provided a resonant circuit including: a capacitor of which a capacitance is variable; and an acoustic wave resonator to which the capacitor is connected in series and/or in parallel, a capacitance of the acoustic wave resonator being to be changed so that a change in input impedance and/or output impedance is reduced when the capacitance of the capacitor is changed.

According to a second aspect of the present invention, there is provided a filter circuit including: one or more series resonators connected in series between an input terminal and an output terminal; and one or more parallel resonators connected in parallel between the input terminal and the output terminal, wherein at least one of the one or more series resonators includes the above resonant circuit, and the capacitor of the resonant circuit is connected in parallel to the acoustic wave resonator.

According to a third aspect of the present invention, there is provided a filter circuit including: one or more series resonators connected in series between an input terminal and an output terminal; and one or more parallel resonators connected in parallel between the input terminal and the output terminal, wherein at least one of the one or more parallel resonators includes the above resonant circuit, and the capacitor of the resonant circuit is connected in series to the acoustic wave resonator.

According to a fourth aspect of the present invention, there is provided an acoustic wave resonator including: a piezoelectric substrate; a pair of reflectors located on the piezoelectric substrate; and IDTs that are located on the piezoelectric substrate between the pair of reflectors and electrically connected in parallel between a first terminal and a second terminal, wherein a switch is to be electrically connected in series between at least one IDT of the IDTs and the first terminal and/or the second terminal

DETAILED DESCRIPTION

Figure 1:
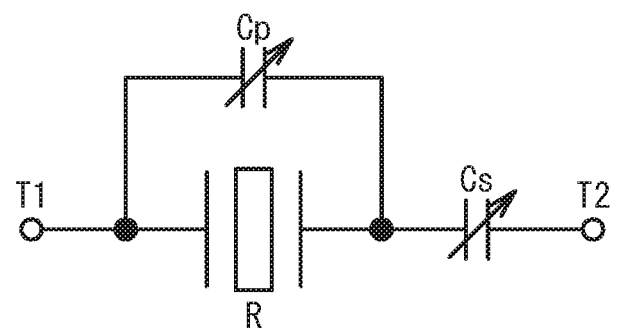
FIG. 1 is a circuit diagram of a resonant circuit in accordance with a first comparative example.

A description will first be given of characteristics when a capacitor is added to a resonator. FIG. 1 is a circuit diagram of a resonant circuit in accordance with a first comparative example. As illustrated in FIG. 1, between terminals T1 and T2, a variable capacitor Cs is connected in series to an acoustic wave resonator R. Between the terminals T1 and T2, a variable capacitor Cp is connected in parallel to the acoustic wave resonator R.

Figure 2A:
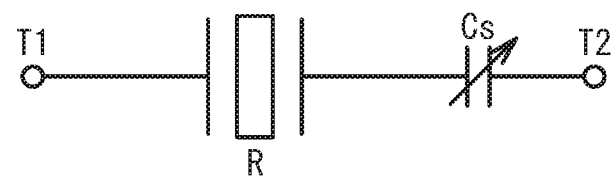
FIG. 2A is a circuit diagram with which the effect of a variable capacitor Cs in the first comparative example was simulated.
Figure 2B:
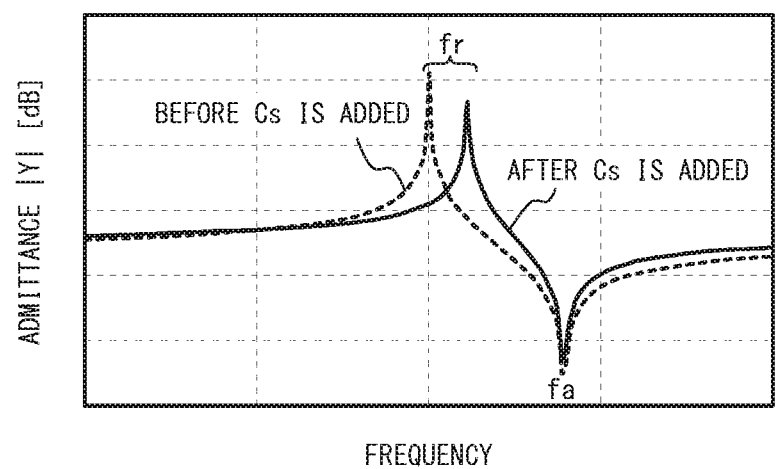
FIG. 2B illustrates frequency characteristics of admittance.

The effects of the variable capacitors Cs and Cp will be described. FIG. 2A is a circuit diagram with which the effect of the variable capacitor Cs in the first comparative example was simulated, and FIG. 2B illustrates frequency characteristics of admittance |Y|. As illustrated in FIG. 2A, the acoustic wave resonator R and the variable capacitor Cs are connected in series between the terminals T1 and T2. In FIG. 2B, the dotted line indicates the admittance characteristic when the capacitance of the variable capacitor Cs is zero, and the solid line indicates the admittance characteristic when the capacitance of the variable capacitor Cs is Cs. The frequency at which the admittance is the smallest is an antiresonant frequency fa, and the frequency at which the admittance is the largest is a resonant frequency fr. The addition of the capacitance Cs does not change the antiresonant frequency fa, but shifts the resonant frequency fr to a higher frequency.

Figure 3A:
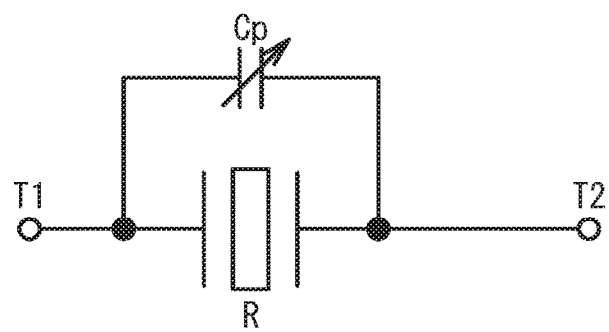
FIG. 3A is a circuit diagram with which the effect of a variable capacitor Cp in the first comparative example was simulated.
Figure 3B:
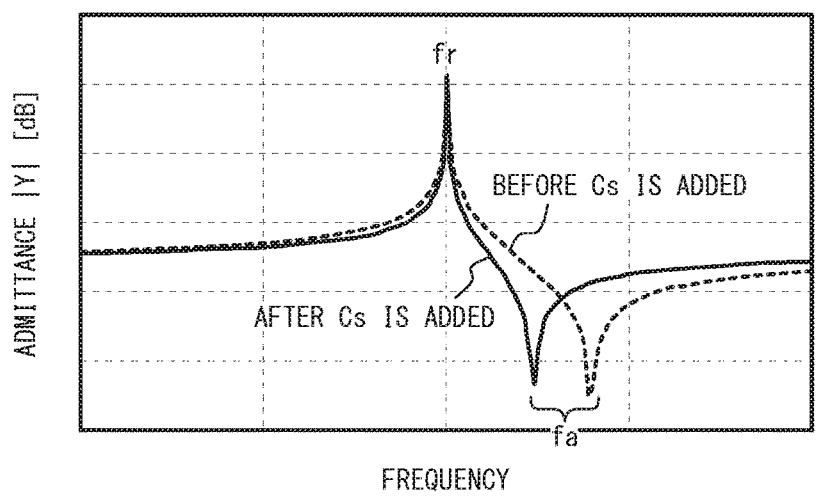
FIG. 3B illustrates frequency characteristics of admittance.

FIG. 3A is a circuit diagram with which the effect of the variable capacitor Cp in the first comparative example was simulated, and FIG. 3B illustrates frequency characteristics of admittance |Y|. As illustrated in FIG. 3A, the acoustic wave resonator R and the variable capacitor Cp are connected in parallel between the terminals T1 and T2. As illustrated in FIG. 3B, the addition of the capacitance Cp does not change the resonant frequency fr, but shifts the antiresonant frequency fa to a lower frequency.

As described above, in the first comparative example, the resonant frequency can be adjusted with the variable capacitor Cs, while the antiresonant frequency can be adjusted with the variable capacitor Cp. As described above, the resonance characteristics of a resonator can be adjusted with the variable capacitors Cs and Cp.

However, the addition of the capacitances Cs and Cp causes the change in impedance characteristics (i.e., admittance characteristic) such as input impedance and output impedance. Accordingly, when the resonator of the first comparative example is used in a filter, impedance mismatch occurs, and the insertion loss thereby increases.

First Embodiment

Figure 4:
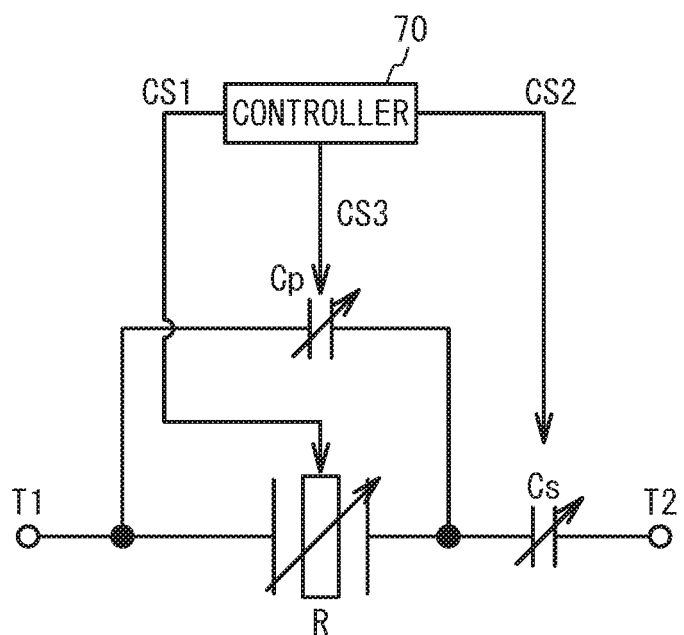
FIG. 4 is a circuit diagram of a resonant circuit in accordance with a first embodiment.

FIG. 4 is a circuit diagram of a resonant circuit in accordance with a first embodiment. As illustrated in FIG. 4, between the terminals T1 and T2, the variable capacitor Cs is connected in series to the acoustic wave resonator R. Between the terminals T1 and T2, the variable capacitor Cp is connected in parallel to the acoustic wave resonator R. The capacitance Cs of the variable capacitor Cs and the capacitance Cp of the variable capacitor Cp are variable. The capacitance C0 (an electrostatic capacitance) of the acoustic wave resonator R is variable. A controller 70 outputs a control signal CS1 to the acoustic wave resonator R, a control signal CS2 to the variable capacitor Cs, and a control signal CS3 to the variable capacitor Cp. The acoustic wave resonator R and the variable capacitors Cs and Cp respectively change the capacitances C0, Cs, and Cp based on the control signals CS1 through CS3. When changing the capacitances Cs and Cp, the controller 70 changes the capacitance C0 so that the change in impedance when the acoustic wave resonator R is viewed from the terminals T1 and T2 is reduced.

Figure 5A:
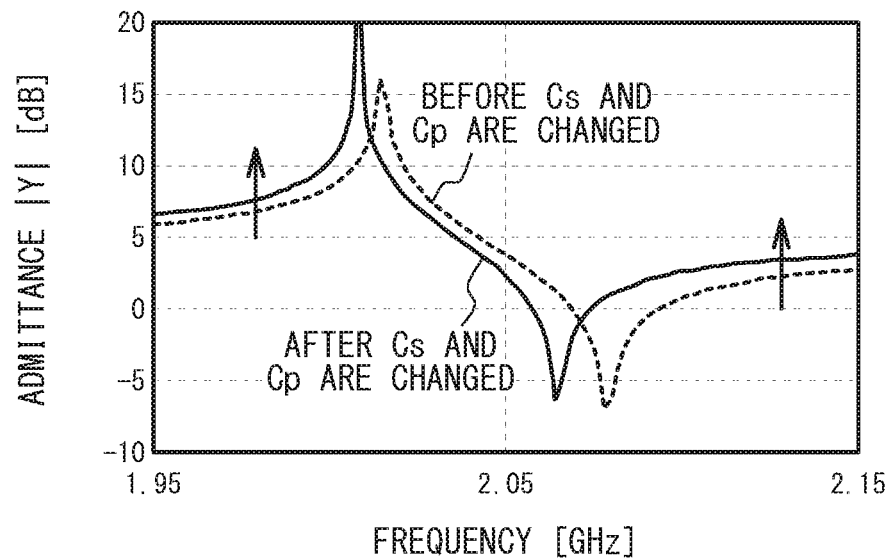
FIG. 5A illustrates simulation results of the admittance characteristic of the first comparative example.
Figure 5B:
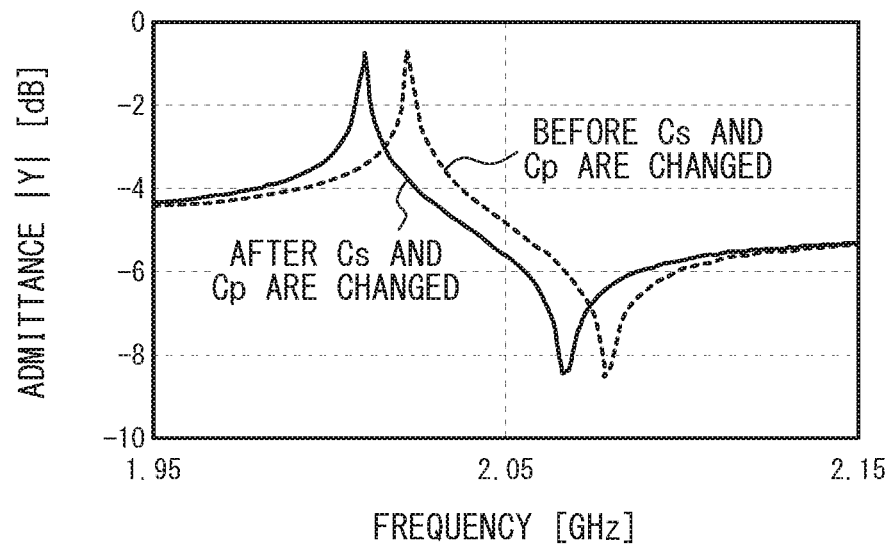
FIG. 5B illustrates simulation results of the admittance characteristic of the first embodiment.

FIG. 5A illustrates simulation results of the admittance characteristic of the first comparative example, and FIG. 5B illustrates simulation result of the admittance characteristic of the first embodiment. In FIG. 5A, the capacitances Cs and Cp of the variable capacitors Cs and Cp are changed without changing the capacitance of the acoustic wave resonator R. The dotted lines indicate the admittance characteristic before the capacitances Cs and Cp are changed, and the solid lines indicate the admittance characteristic after the capacitances Cs and Cp are changed. The change of the capacitances Cs and Cp shifts the antiresonant frequency fa and the resonant frequency fr to lower frequencies. Furthermore, as indicated by arrows, the admittance increases.

In FIG. 5B, the capacitance C0 of the acoustic wave resonator R is changed when the capacitances Cs and Cp are changed. The change of the capacitances Cs and Cp shifts the antiresonant frequency fa and the resonant frequency fr to lower frequencies, and makes the admittance nearly unchanged.

In the first embodiment, the capacitance C0 of the acoustic wave resonator R is to be changed so that the change in input impedance and/or output impedance of the resonant circuit is reduced when the capacitances Cs and Cp are changed. Accordingly, the change in impedance characteristics when the resonant frequency and/or the antiresonant frequency of the resonant circuit is changed can be reduced. The resonant circuit may include the controller 70, or may not necessarily include the controller 70.

When the amounts of change in capacitances Cs and Cp are respectively represented by $\Delta Cs$ and $\Delta Cp$, the amount of change in capacitance C0 (represented by $\Delta C0$) is changed in accordance with the following equation 1.

$$\Delta C0=(\Delta Cs \times \Delta Cp - C0^2 - \Delta Cp \times C0)/(C0-\Delta Cs) \quad (1)$$

This configuration reduces the change in input impedance and output impedance (i.e., the impedances viewed from the terminals T1 and T2) of the resonant circuit when the capacitances Cs and Cp are changed.

In the first embodiment, the resonant circuit includes the variable capacitors Cs and Cp, but it is only required that the resonant circuit includes the variable capacitor Cs or Cp. Moreover, it is only required that the input impedance or the output impedance of the acoustic wave resonator R is reduced.

Figure 6:
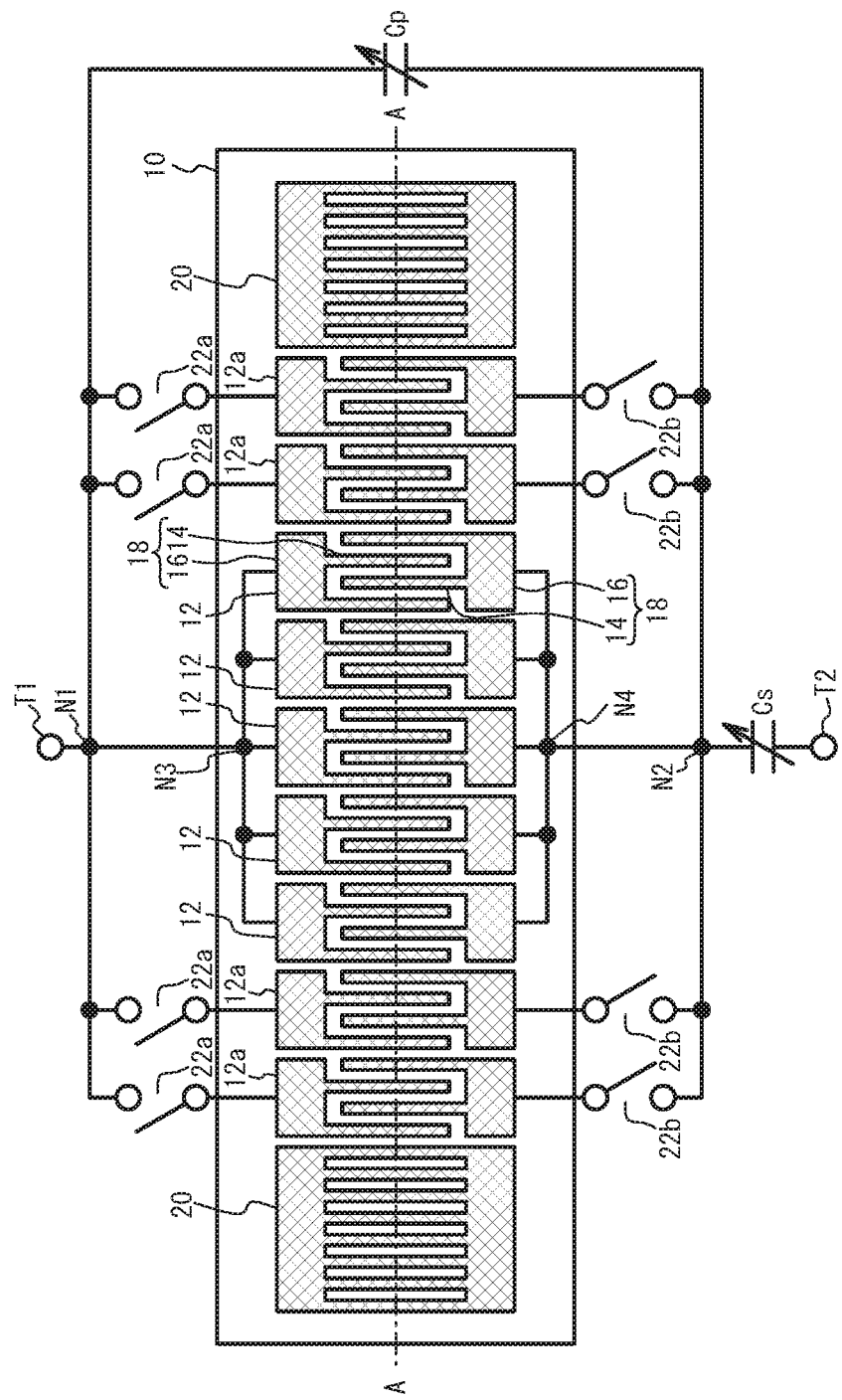
FIG. 6 illustrates a resonant circuit in accordance with a first variation of the first embodiment.
Figure 7:
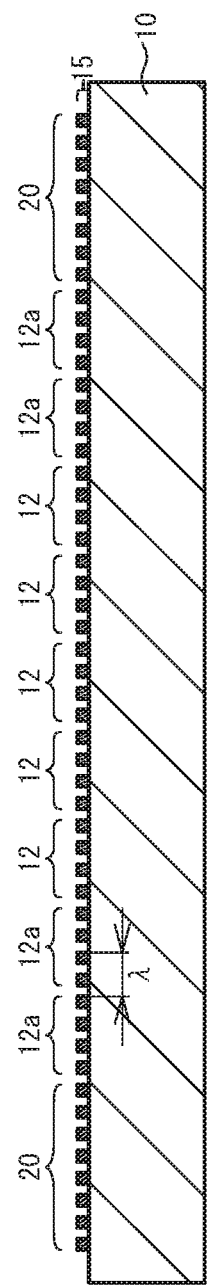
FIG. 7 is a cross-sectional view of the acoustic wave resonator of the first variation of the first embodiment taken along line A-A in FIG. 6.

FIG. 6 illustrates a resonant circuit in accordance with a first variation of the first embodiment. FIG. 7 is a cross-sectional view of the acoustic wave resonator of the first variation of the first embodiment taken along line A-A in FIG. 6. As illustrated in FIG. 6 and FIG. 7, Interdigital Transducers (IDTs) 12 and 12a and reflectors 20 are formed on a piezoelectric substrate 10. The IDTs 12 and 12a and the reflectors 20 are formed of a metal film 15 formed on the piezoelectric substrate 10. Each of the IDTs 12 and 12a includes a pair of comb-shaped electrodes 18 facing each other. The comb-shaped electrode 18 includes electrode fingers 14 and a bus bar 16 to which the electrode fingers 14 are connected. The electrode fingers 14 of one of the comb-shaped electrodes 18 and the electrode fingers 14 of the other of the comb-shaped electrodes 18 are arranged substantially alternately. The alignment direction of the electrode fingers 14 corresponds to the propagation direction of an acoustic wave excited by the IDTs 12 and 12a. The pitch $\lambda$ of a pair of the electrode fingers 14 substantially corresponds to the wavelength of the acoustic wave. The IDTs 12 and 12a are arranged in the propagation direction of the acoustic wave between a pair of the reflectors 20. The pitch $\lambda$ of the electrode fingers 14 is approximately the same among the IDTs 12 and 12a, and aperture lengths (the length along which the electrode fingers 14 overlap) are approximately the same among the IDTs 12 and 12a. The bus bars 16 of the IDTs 12 and 12a separate from each other.

Between nodes N1 and N2, the variable capacitor Cp is connected in parallel to the IDTs 12 and 12a. Between the node N2 and the terminal T2, the variable capacitor Cs is connected. The IDTs 12 are connected in parallel between nodes N3 and N4 on the piezoelectric substrate 10. The IDTs 12a are coupled to the node N1 via switches 22a, and coupled to the node N2 via switches 22b. When the switches 22a and 22b are turned on, the IDT 12a is connected in parallel to the IDTs 12 between the nodes N1 and N2. Accordingly, the IDT 12a excites the acoustic wave. The capacitance between the nodes N1 and N2 increases by the capacitance of the IDT 12a. When the switches 22a and 22b are turned off, the IDT 12a becomes floating. Accordingly, the IDT 12a functions as a reflector that reflects the acoustic wave. The capacitance between the nodes N1 and N2 decreases by the capacitance of the IDT 12a.

The piezoelectric substrate 10 may be, for example, a lithium tantalate substrate or a lithium niobate substrate. The metal film 15 may be made of, for example, an aluminum film or a copper film. The switches 22a and 22b may be, for example, Metal Oxide Semiconductor Field Effect Transistors (MOSFETs).

Figure 8:
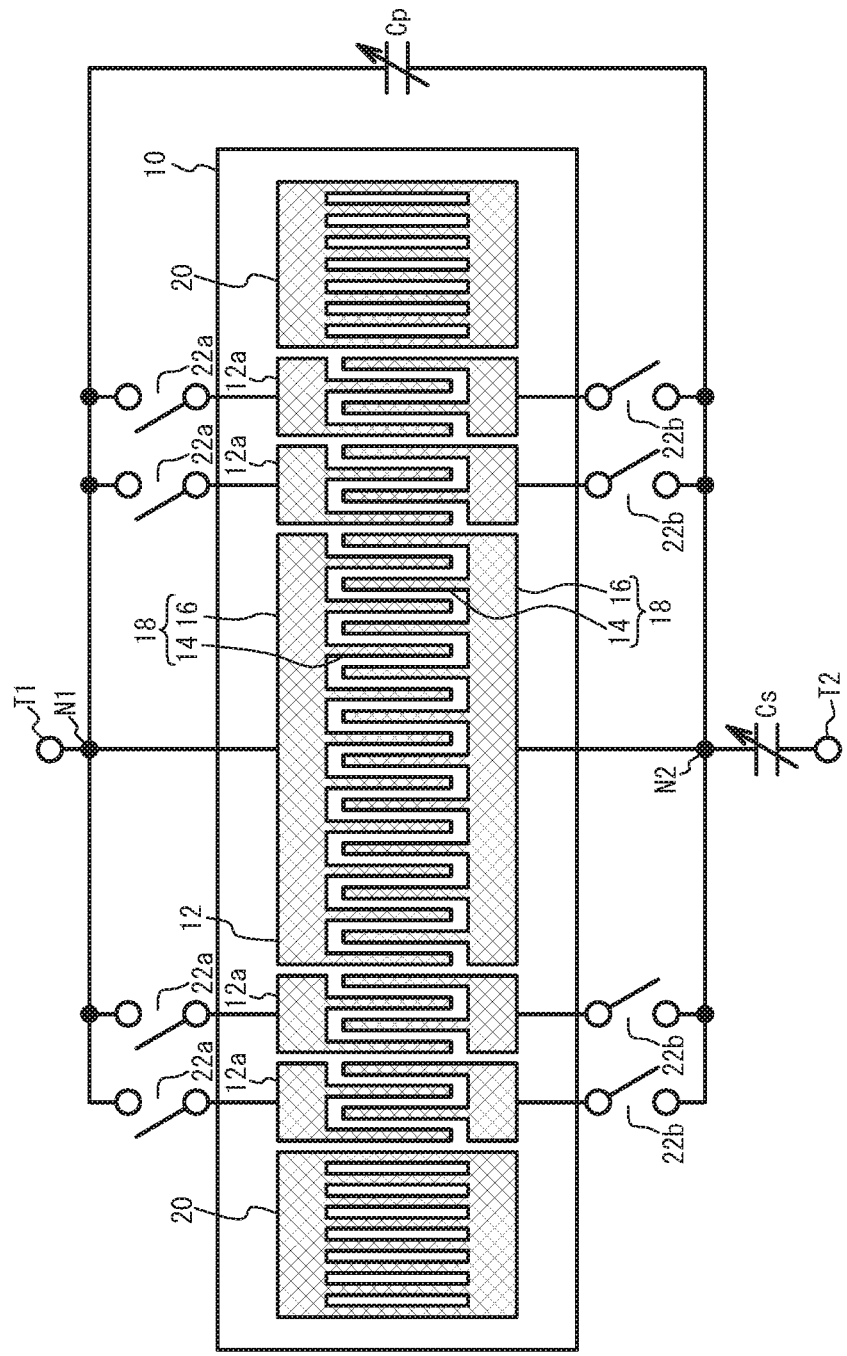
FIG. 8 illustrates a resonant circuit in accordance with a second variation of the first embodiment.

FIG. 8 illustrates a resonant circuit in accordance with a second variation of the first embodiment. As illustrated in FIG. 8, the IDTs 12 that are not connected to the switch 22a or 22b may have the common bus bars 16. Other configurations are the same as those of the first variation of the first embodiment, and thus the description thereof is omitted.

Figure 9:
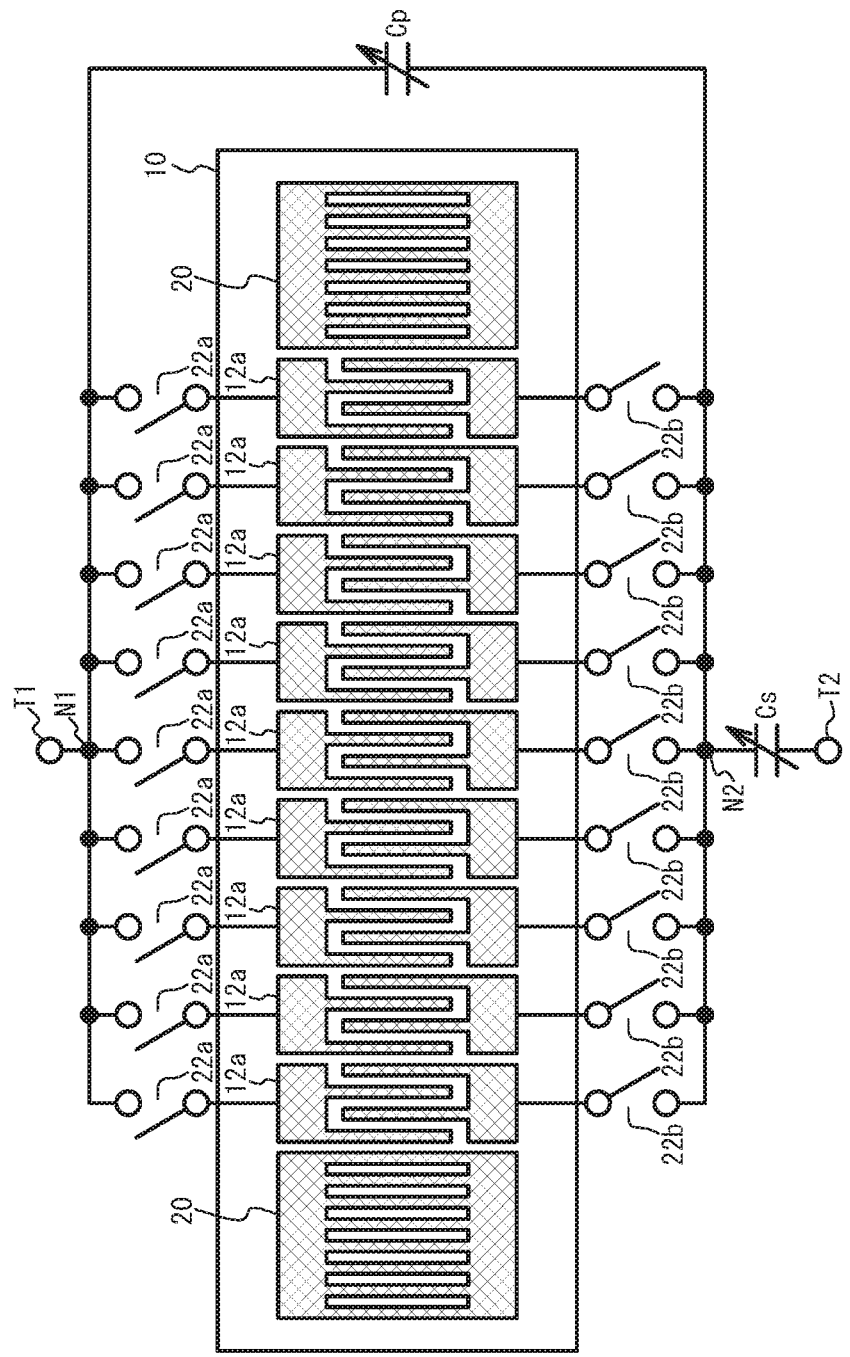
FIG. 9 illustrates a resonant circuit in accordance with a third variation of the first embodiment.

FIG. 9 illustrates a resonant circuit in accordance with a third variation of the first embodiment. As illustrated in FIG. 9, all the IDTs 12a sandwiched between the reflectors 20 may be connected to the switches 22a and 22b. Other configurations are the same as those of the first variation of the first embodiment, and thus the description is omitted.

In the first through third variations of the first embodiment, the IDTs 12 and 12a are located on the piezoelectric substrate 10 between a pair of the reflectors 20, and are electrically connected in parallel between the nodes N1 and N2 (a first node and a second node, or a first terminal and a second terminal). At least the IDT 12a, which is one of the IDTs, can be disconnected from the nodes N1 and N2. Accordingly, the capacitance of the acoustic wave resonator R can be changed.

The switches 22a and 22b (first switches) are electrically connected in series between the IDT 12a and the nodes N1 and N2. This configuration allows the switches 22a and 22b to electrically connect or disconnect the IDT 12a between the nodes N1 and N2. The controller 70 can change the capacitance of the acoustic wave resonator R by switching (for example, turning on or off) the switches 22a and 22b. As long as one of the switches 22a and 22b is provided, the capacitance of the acoustic wave resonator R can be changed. To make the IDT 12a floating, both the switches 22a and 22b are preferably provided.

When the switches 22a and 22b are turned off, the IDT 12a functions as a reflector. When the IDT 12a is located between the IDTs 12, the IDTs 12 are separated by the IDT 12a. When the switches 22a and 22b are turned off, the IDT 12a functioning as a reflector is to be located between the IDTs 12. This situation makes the circuit equivalent to a circuit in which the acoustic wave resonators are connected in parallel, therefore complicating the operation.

Thus, as described in the first and second variations of the first embodiment, the IDT 12a (a second IDT) to which the switches 22a and 22b are to be coupled is located between the IDT 12 (a first IDT), to which the switches 22a and 22b are not to be coupled, and the reflector 20. In addition, when the IDTs 12a are provided, the switches 22a and 22b are turned on from the switches 22a and 22b for the IDT 12a located closest to the reflector 20 toward the switches 22a and 22b for the IDT 12a located closest to the IDT 12, and the switches 22a and 22b are turned off from the switches 22a and 22b for the IDT 12a located closest to the IDT 12 toward the switches 22a and 22b for the IDT 12a located closest to the reflector 20. This operation can inhibit the circuit from becoming equivalent to a circuit in which the acoustic wave resonators are connected in parallel. The IDT 12a may be located between one of the reflectors 20 and the IDT 12, and may not be necessarily located between the other of the reflectors 20 and the IDT 12.

The IDTs 12 and 12b may have the same number of pairs of electrode fingers, or different numbers of pairs of electrode fingers. When the number of pairs per one IDT 12a is decreased and the number of the IDTs 12a is increased, the capacitance of the acoustic wave resonator R can be more precisely adjusted. The number of the switches 22a and 22b can be reduced by decreasing the number of the IDTs 12a. To precisely adjust the capacitance of the acoustic wave resonator R, the number of pairs in the IDT 12a is preferably less than the number of pairs in the IDT 12.

Figure 10:
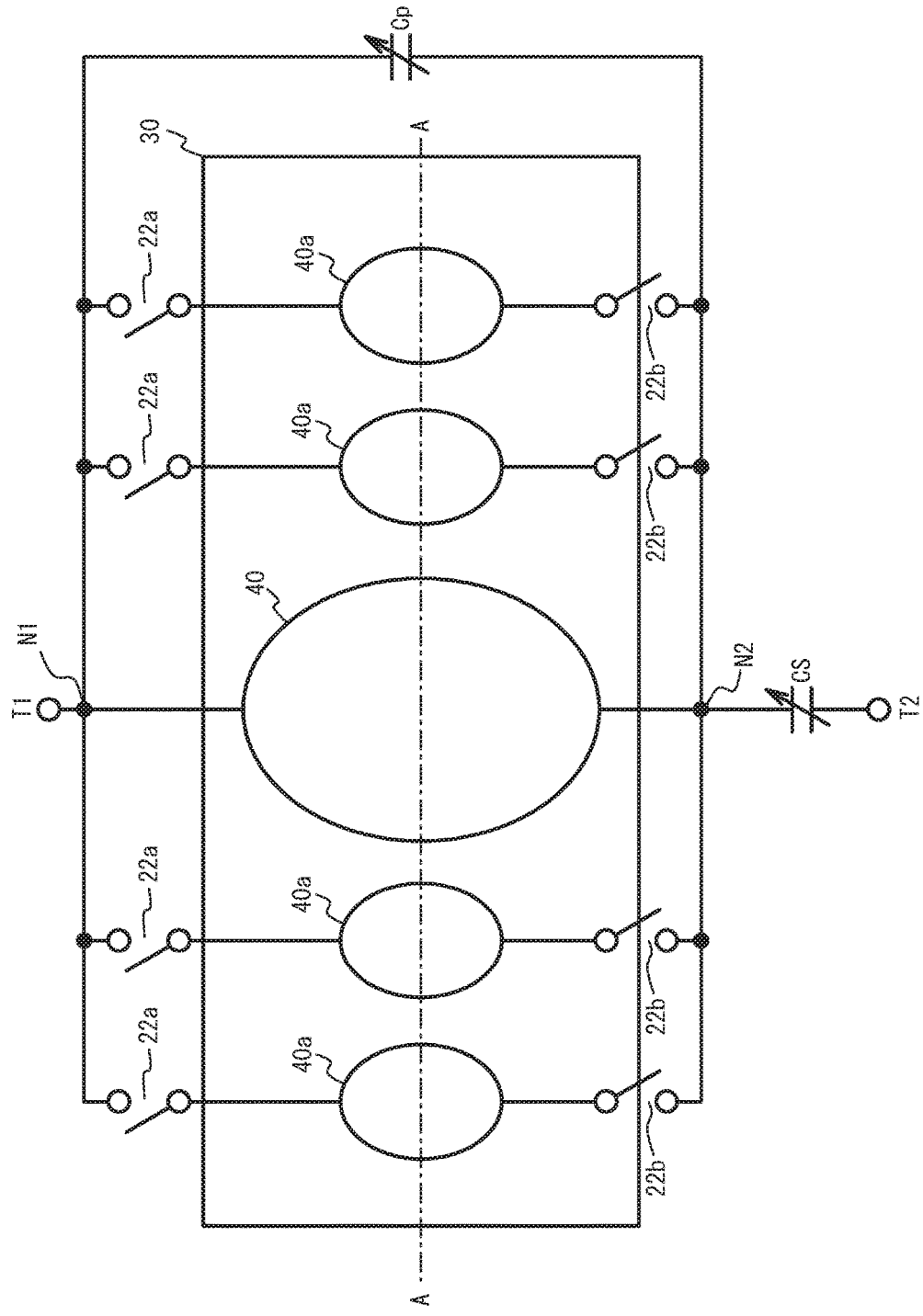
FIG. 10 illustrates a resonant circuit in accordance with a fourth variation of the first embodiment.
Figure 11:
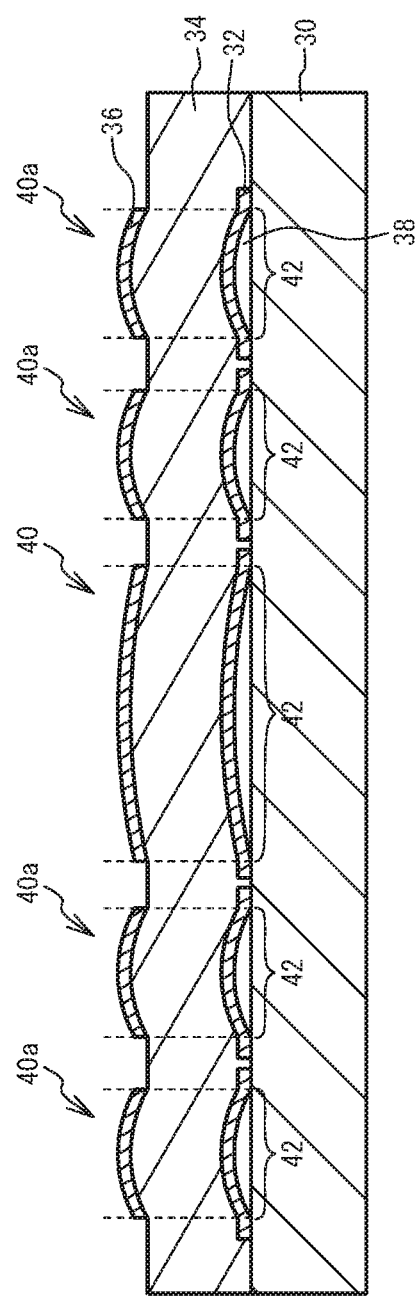
FIG. 11 is a cross-sectional view of the acoustic wave resonator of the fourth variation of the first embodiment taken along line A-A in FIG. 10.

FIG. 10 illustrates a resonant circuit in accordance with a fourth variation of the first embodiment. FIG. 11 is a cross-sectional view of the acoustic wave resonator in the fourth variation of the first embodiment taken along line A-A in FIG. 10. As illustrated in FIG. 10 and FIG. 11, piezoelectric thin film resonators 40 and 40a are formed on a substrate 30. Each of the piezoelectric thin film resonators 40 and 40a includes a piezoelectric film 34 located on the substrate 30. A lower electrode 32 and an upper electrode 36 are located so as to sandwich the piezoelectric film 34. A region where the lower electrode 32 and the upper electrode 36 face each other across the piezoelectric film 34 is a resonance region 42. An air gap 38 is formed between the lower electrode 32 and the substrate 30 in the resonance region 42. Instead of the air gap 38, an acoustic mirror reflecting the acoustic wave may be provided. The capacitances of the piezoelectric thin film resonators 40 and 40a are proportional to the area of the resonance region 42.

The piezoelectric thin film resonators 40 and 40a are connected in parallel between the nodes N1 and N2. The piezoelectric thin film resonators 40a are coupled to the node N1 via the switches 22a, and coupled to the node N2 via the switches 22b. When the switches 22a and 22b are turned on, the piezoelectric thin film resonator 40a is connected in parallel to the piezoelectric thin film resonator 40 between the nodes N1 and N2. The capacitance between the nodes N1 and N2 increases by the capacitance of the piezoelectric thin film resonator 40a. When the switches 22a and 22b are turned off, the piezoelectric thin film resonator 40a becomes floating, and the capacitance between the nodes N1 and N2 decreases by the capacitance of the piezoelectric thin film resonator 40a.

The substrate 30 may be, for example, a semiconductor substrate such as a silicon substrate or an insulating substrate. The lower electrode 32 and the upper electrode 36 may be formed of a metal film having a large acoustic impedance such as a ruthenium film. The piezoelectric film 34 may be made of an aluminum nitride film. An exemplary case where the resonance region 42 has an elliptical shape is described, but the resonance region 42 may have a polygonal shape. Other configurations are the same as those of the first variation of the first embodiment, and the description thereof is thus omitted.

In the fourth variation of the first embodiment, the piezoelectric thin film resonators 40 and 40a are electrically connected in parallel between the nodes N1 and N2. At least the piezoelectric thin film resonator 40a, which is one of the piezoelectric thin film resonators, can be disconnected from at least one of the nodes N1 and N2. Accordingly, the capacitance of the acoustic wave resonator R can be changed.

The switches 22a and 22b are electrically connected in series between the piezoelectric thin film resonator 40a and the nodes N1 and N2. This configuration allows the piezoelectric thin film resonator 40a to be electrically connected to or disconnected from the nodes N1 and N2. Therefore, the controller 70 can change the capacitance of the acoustic wave resonator R by turning on or off the switches 22a and 22b. As long as one of the switches 22a and 22b is provided, the capacitance of the acoustic wave resonator R can be changed. To make the IDT 12a floating, both the switches 22a and 22b are preferably provided.

The area of the resonance region 42 may be the same or differ between the piezoelectric thin film resonators 40 and 40a. To precisely adjust the capacitance of the acoustic wave resonator R, the area of the resonance region 42 of the piezoelectric thin film resonator 40a is preferably less than that of the piezoelectric thin film resonator 40. An exemplary case where a single piezoelectric thin film resonator 40 is provided is described, but a plurality of piezoelectric thin film resonators 40 may be provided.

Figure 12:
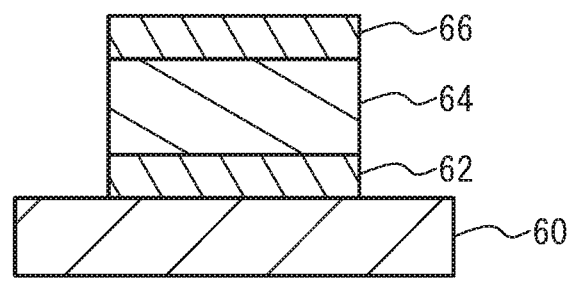
FIG. 12 is a cross-sectional view illustrating a first example of a variable capacitor.

A first example of the variable capacitor used in the first embodiment and the variations thereof will be described. FIG. 12 is a cross-sectional view illustrating the first example of the variable capacitor. A lower electrode 62 is located on a substrate 60. A ferroelectric film 64 is located on the lower electrode 62. An upper electrode 66 is located on the ferroelectric film 64. The ferroelectric film 64 may be made of, for example, a barium strontium titanate (BaSr-TiO$_3$:BST) film. The lower electrode 62 and the upper electrode 66 may be made of a metal film. The substrate 60 may be the piezoelectric substrate 10 of the first through third variations of the first embodiment, or the substrate 30 of the fourth variation of the first embodiment. This configuration allows the IDTs or the piezoelectric thin film resonators and the variable capacitor to be located on the same substrate. The permittivity of the ferroelectric film 64 changes when a direct current voltage is applied to the ferroelectric film 64. The capacitance between the lower electrode 62 and the upper electrode 66 can be changed by applying a direct current voltage between the lower electrode 62 and the upper electrode 66.

Figure 13A:
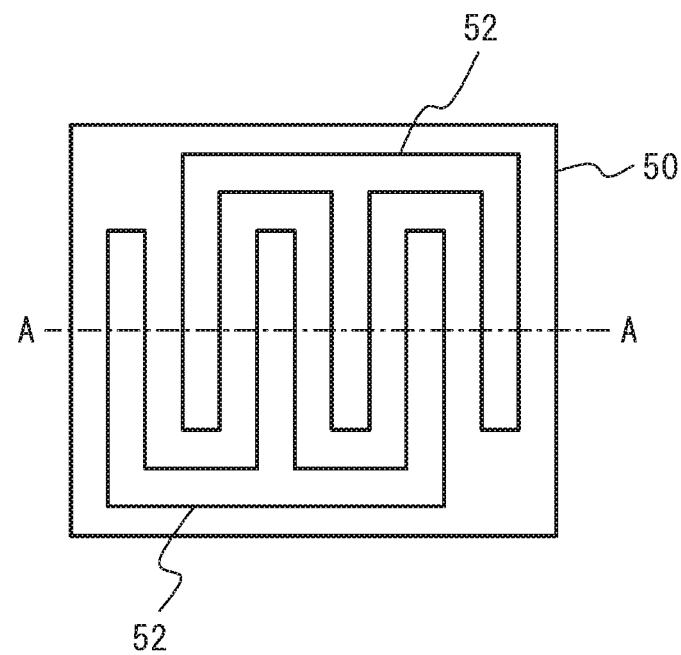
FIG. 13A is a plan view illustrating a second example of the variable capacitor.
Figure 13B:
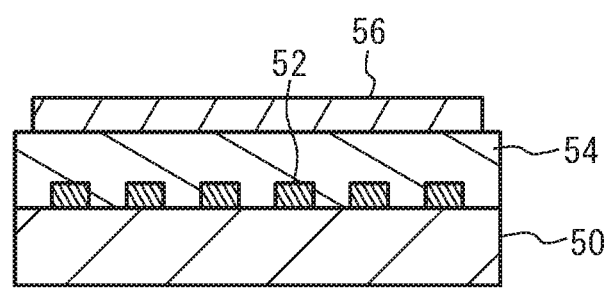
FIG. 13B is a cross-sectional view taken along line A-A in FIG. 13A.

FIG. 13A is a plan view of a second example of the variable capacitor, and FIG. 13B is a cross-sectional view taken along line A-A in FIG. 13A. As illustrated in FIG. 13A and FIG. 13B, electrodes 52 are located on a substrate 50. The electrodes 52 are, for example, comb-shaped electrodes. A ferroelectric film 54 is located on the substrate 50 so as to cover the electrodes 52. An electrode 56 is located on the ferroelectric film 54. The electrode 56 is located so as to overlap with the electrodes 52 in plan view. The ferroelectric film 54 may be made of, for example, a barium strontium titanate film. The electrodes 52 and 56 may be of a metal film. The substrate 50 may be the piezoelectric substrate 10 of the first through third variations of the first embodiment, or the substrate 30 of the fourth variation of the first embodiment. This configuration allows the IDTs or the piezoelectric thin film resonators and the variable capacitor to be located on the same substrate. The application of a voltage to the electrode 56 changes the permittivity of the ferroelectric film 54, changing the capacitance between the electrodes 52.

In the second example of the variable capacitor, the electrodes 52 (a first electrode and a second electrode) are located on the substrate 50 so as to face each other. The ferroelectric film 54 covers the electrodes 52. The voltage application electrode 56 is located on the ferroelectric film 54 so as to overlap with the electrodes 52 in plan view. Depending on the voltage (for example, direct current voltage) applied to the voltage application electrode 56, the permittivity of the ferroelectric film 54 changes. Accordingly, the capacitance between the electrodes 52 changes. As described above, the capacitance of the variable capacitor can be changed.

Figure 14:
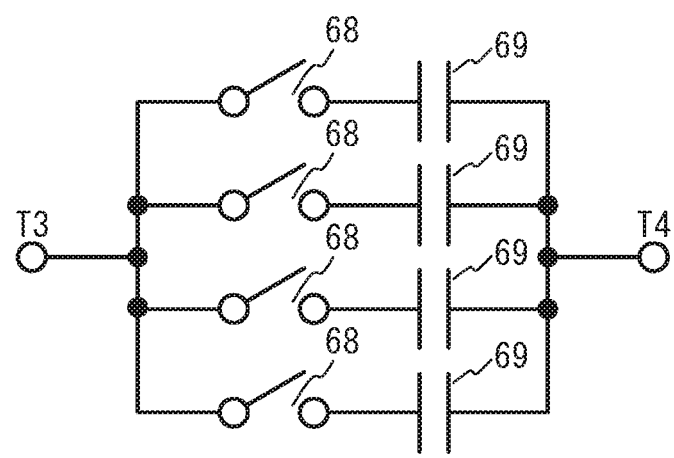
FIG. 14 is a circuit diagram illustrating a third example of the variable capacitor.

FIG. 14 is a circuit diagram illustrating a third example of the variable capacitor. As illustrated in FIG. 14, the variable capacitor is a switched capacitor. Between terminals T3 and T4, capacitor elements 69 are connected in parallel. Switches 68 are connected in series to the capacitor elements 69. When the switch 68 is turned on, the capacitor element 69 is connected between the terminals T3 and T4. The capacitance between the terminals T3 and T4 can be changed by turning on or off the switches 68.

In the third example of the variable capacitor, the capacitor elements 69 are connected in parallel between the terminal T3 (a third node) and the terminal T4 (a fourth node). Each of the switches 68 (second switches) electrically connects and disconnects the corresponding capacitor element 69 between the nodes N3 and N4. The capacitance of the variable capacitor can be changed by switching (turning on and off) the switches 68.

Second Embodiment

Figure 15:
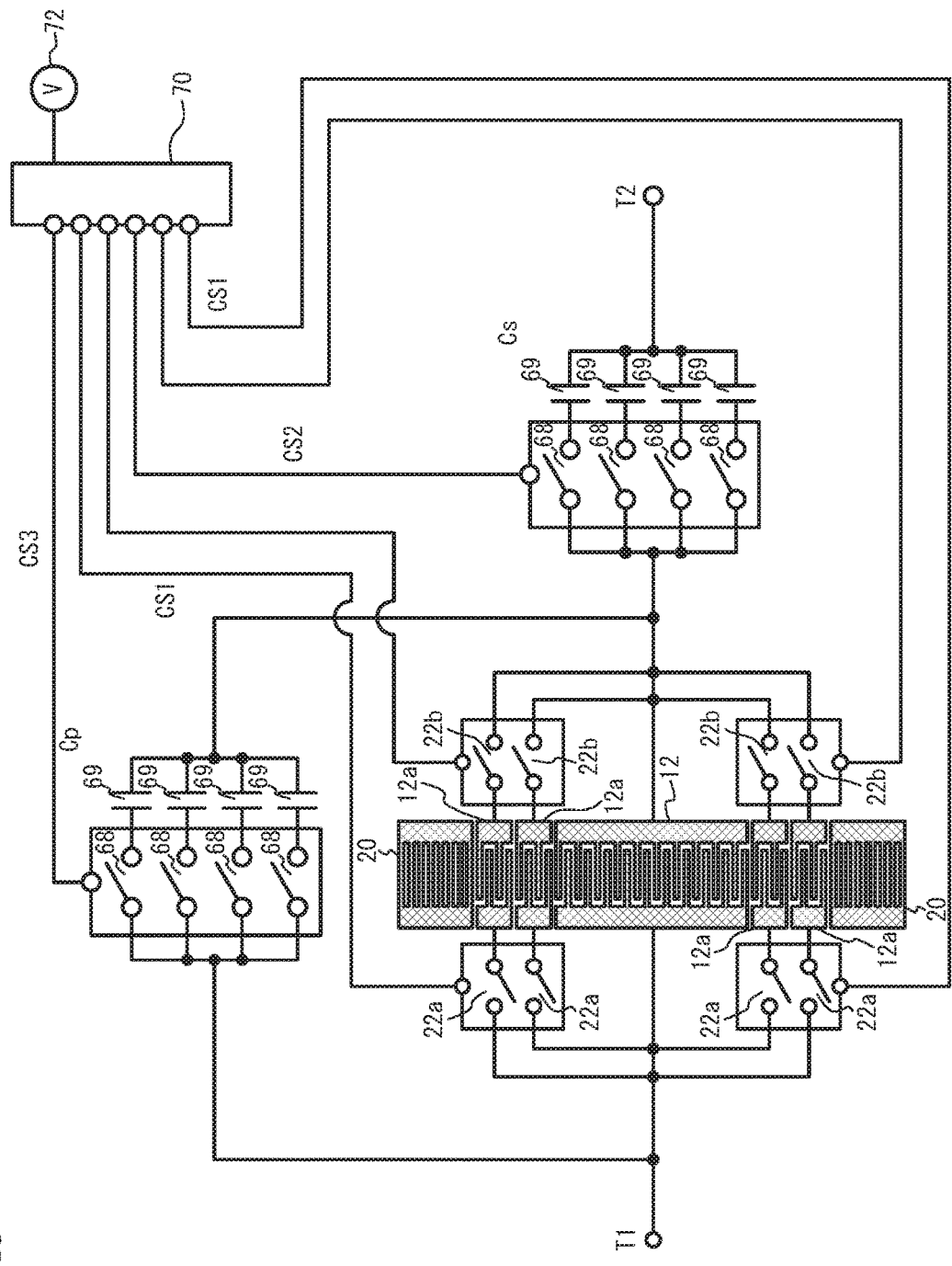
FIG. 15 is a block diagram of a resonant circuit in accordance with a second embodiment.

FIG. 15 is a block diagram of a resonant circuit in accordance with a second embodiment. The second embodiment uses the acoustic wave resonator of the second variation of the first embodiment as the acoustic wave resonator R. For example, the piezoelectric substrate 10 is a 42° rotated Y-cut lithium tantalate substrate, the total number of pairs in the IDT 12 is 100 pairs, and the aperture length is 100 µm. The number of the electrode fingers of the reflector 20 is 20. When the permittivities ε11 and ε33 of lithium tantalate are respectively 42.6 and 42.7, the capacitance per a pair of electrode fingers is 0.038 pF. When the number of pairs per one IDT 12a is two pairs, and the number of the IDTs 12a are four, the capacitance C0 can be changed by up to 0.308 pF. When ΔC0 is 0.308 pF in the equation 1, the impedance can be adjusted when the capacitance Cs is 46 pF or greater and the capacitance Cp is 0.308 pF or less.

The second embodiment uses the variable capacitor of FIG. 14 as the variable capacitors Cs and Cp. The variable capacitor is formed on, for example, a Semiconductor on Insulator (SOI) substrate. The controller 70 is, for example, a processor of a mobile terminal or a designated Integrated Circuit (IC). The controller 70 is supplied with electrical power from a power source 72. The controller 70 outputs the control signals CS1 to the switches 22a and 22b. The switches 22a and 22b are integrated by, for example, twos. The control signals CS1 are 2-bit signals. The controller 70 respectively outputs the control signals CS2 and CS3 to the switches 68 of the variable capacitors Cs and Cp. The control signals CS2 and CS3 are 4-bit signals.

Figure 16:
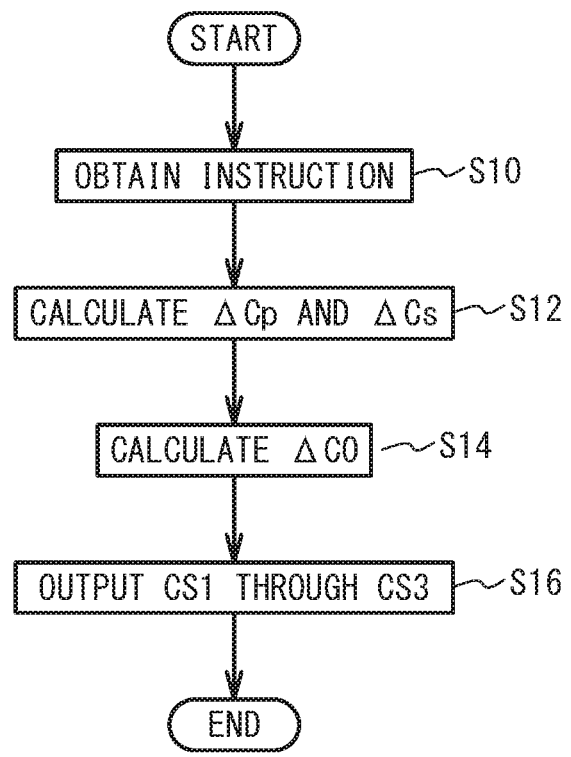
FIG. 16 is a flowchart illustrating the operation of a controller in the second embodiment.

FIG. 16 is a flowchart of the operation of the controller 70 in the second embodiment. As illustrated in FIG. 16, the controller 70 obtains an instruction for frequency characteristics (step S10). For example, the controller 70 obtains the passband of a filter circuit including the resonant circuit of the second embodiment. Alternatively, for example, the controller 70 obtains the LTE band using a filter circuit including the resonant circuit. The controller 70 calculates the amount ΔCs and/or ΔCp of change in the capacitance Cs and/or Cp in accordance with desired frequency characteristics (step S12). The controller 70 calculates the amount ΔC0 of change in the capacitance C0 of the acoustic wave resonator R based on ΔCs and/or ΔCp (step S14). For example, the controller 70 calculates ΔC0 with the equation 1. The controller 70 outputs the control signals CS1 through CS3 respectively corresponding to ΔCs, ΔCp, and ΔC0 (step S16). The capacitances Cs, Cp, and C0 respectively change by ΔCs, ΔCp, and ΔC0. The above operation can reduce the change in input impedance and/or output impedance of the resonant circuit, and change the resonant frequency and/or the antiresonant frequency of the resonant circuit.

The controller 70 may have tables of the control signals CS1 through CS3 in accordance with the instruction obtained at step S10 (for example, the LTE band), and output the control signals CS1 through CS3 in accordance with the tables.

Third Embodiment

Figure 17A:
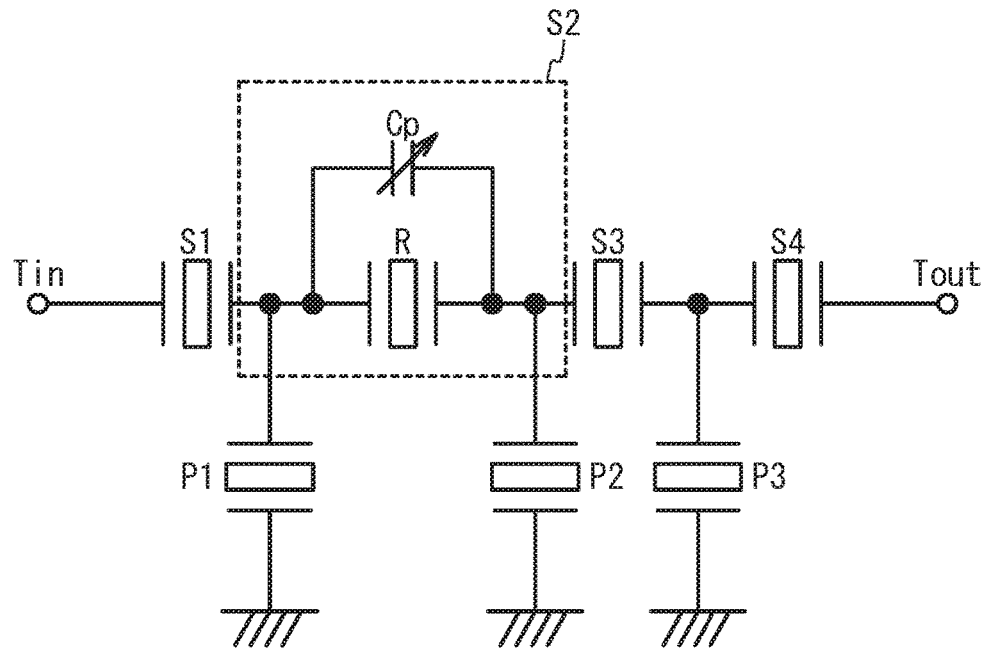
FIG. 17A is a circuit diagram of a filter circuit in accordance with a third embodiment.
Figure 17B:
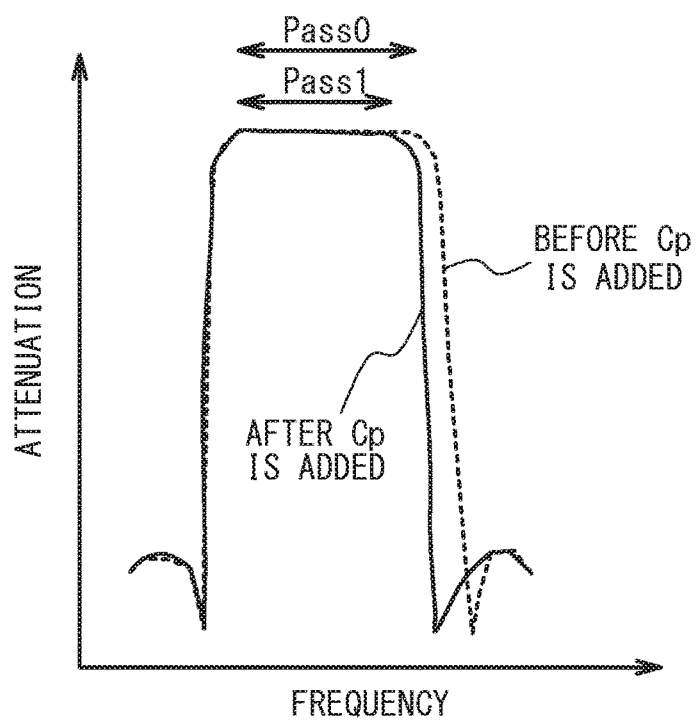
FIG. 17B illustrates pass characteristics.

FIG. 17A is a circuit diagram of a filter circuit in accordance with a third embodiment, and FIG. 17B illustrates pass characteristics. As illustrated in FIG. 17A, between an input terminal Tin and an output terminal Tout, one or more series resonators S1 through S4 are connected in series. Between the input terminal Tin and the output terminal Tout, one or more parallel resonators P1 through P3 are connected in parallel. The resonant circuit of any one of the first embodiment and the variations thereof is used for the series resonator S2 having the lowest antiresonant frequency among the series resonators S1 through S4. In the resonant circuit, the acoustic wave resonator R and the variable capacitor Cp are connected in parallel.

The attenuation range at frequencies higher than the passband of the ladder-type filter is formed by the antiresonant frequency of the series resonator. The steepness at frequencies higher than the passband is affected mainly by the lowest antiresonant frequency among the antiresonant frequencies of the series resonators. Thus, the capacitance of the variable capacitor Cp of the series resonator S2 having the lowest antiresonant frequency is changed to change the antiresonant frequency. As illustrated in FIG. 17B, the passband Pass1 after the capacitance Cp is added becomes narrower than the passband Pass0 before the capacitance Cp is added. In addition, the skirt characteristic at frequencies higher than the passband Pass1 becomes steeper.

For example, the LTE band 2 has a transmit band from 1850 MHz to 1910 MHz and a receive band from 1930 MHz to 1990 MHz, and the LTE band 25 has a transmit band from 1850 MHz to 1915 MHz and a receive band from 1930 MHz to 1995 MHz. As described above, the lower ends of the frequency ranges of the transmit band and the receive band of the LTE band 2 are the same as those of the LTE band 25, and the higher ends of the frequency ranges of the transmit band and the receive band of the LTE band 2 are lower than those of the LTE band 25.

Hence, when the filter circuit is used as the transmit filter or the receive filter of the LTE band 25, the capacitance Cp is not added. This configuration widens the passband, allowing the widened passband to be used as the transmit band or the receive band of the LTE band 25. When the filter circuit is used as the transmit filter or the receive filter of the LTE band 2, the capacitance Cp is added. This configuration narrows the passband, allowing the narrowed passband to be used as the transmit band or the receive band of the LTE band 2, and makes the skirt characteristic at frequencies higher than the passband steeper.

In the third embodiment, the variable capacitor Cp is connected in parallel to at least one of the series resonators S1 through S4 in a ladder-type filter. This configuration allows the skirt characteristic at frequencies higher than the passband to be adjusted. In addition, even when the capacitance of the variable capacitor Cp changes, the change in impedance of the resonant circuit can be reduced. Accordingly, the loss of the passband due to impedance mismatch can be reduced.

In addition, the series resonator S2 having the lowest antiresonant frequency is the resonant circuit of any one of the first embodiment and the variations thereof including the variable capacitor Cp, and at least one of the remaining series resonators do not include the resonant circuit of any one of the first embodiment and the variations thereof. This configuration allows the higher end of the frequency range of the passband to be efficiently adjusted.

Figure 18A:
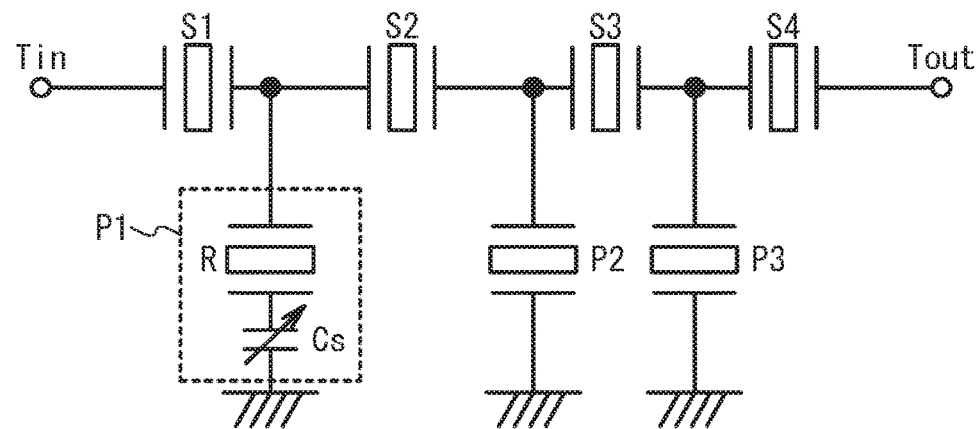
FIG. 18A is a circuit diagram of a filter circuit in accordance with a first variation of the third embodiment.
Figure 18B:
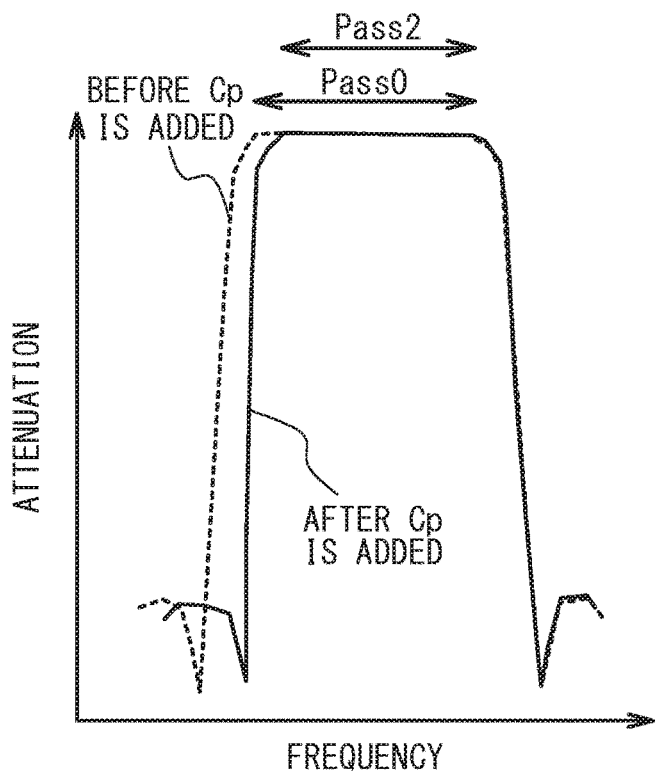
FIG. 18B illustrates pass characteristics.

FIG. 18A is a circuit diagram of a filter circuit in accordance with a first variation of the third embodiment, and FIG. 18B illustrates pass characteristics. As illustrated in FIG. 18A, the resonant circuit of any one of the first embodiment and the variations thereof is used for the parallel resonator P1 having the highest resonant frequency among the parallel resonators P1 through P3. In the resonant circuit, the acoustic wave resonator R and the variable capacitor Cs are connected in series.

The attenuation range at frequencies lower than the passband of the ladder-type filter is formed by the resonant frequency of the parallel resonator. The steepness at frequencies lower than the passband is mainly affected by the highest resonant frequency among the resonant frequencies of the parallel resonators. Thus, the capacitance of the variable capacitor Cs of the parallel resonator P1 having the highest resonant frequency is changed to change the resonant frequency. As illustrated in FIG. 18B, the passband Pass2 when the capacitance Cs is added becomes narrower than the passband Pass0 before the capacitance Cs is added. The skirt characteristics at frequencies lower than the passband Pass0 becomes steeper.

In the first variation of the third embodiment, the variable capacitor Cs is connected in series to at least one of the parallel resonators P1 through P3 in a ladder-type filter. This configuration allows the skirt characteristics at frequencies lower than the passband to be adjusted.

In addition, the parallel resonator P1 with the highest resonant frequency is the resonant circuit of any one of the first embodiment and the variations thereof including the variable capacitor Cs, and at least one of the remaining parallel resonators does not include the resonant circuit of any one of the first embodiment or the variations thereof. This configuration allows the lower end of the frequency range of the passband to be efficiently adjusted.

At least one of the series resonators S1 through S4 and at least one of the parallel resonators P1 through P3 may include the resonant circuit of any one of the first embodiment and the variations thereof. The resonant circuit included in at least one of the series resonators S1 through S4 may include the variable capacitor Cp. The resonant circuit included in at least one of the parallel resonators P1 through P3 may include the variable capacitor Cs. The pass characteristics of the passband can be adjusted by adjusting the resonant frequency of the series resonator and/or the antiresonant frequency of the parallel resonator. The number of series resonators and the number of parallel resonators can be appropriately selected. The resonant circuit of any one of the first embodiment and the variations thereof may be used in a filter other than the ladder-type filter.

Fourth Embodiment

Figure 19:
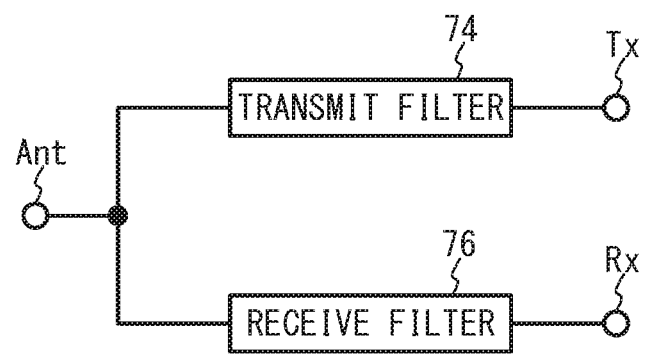
FIG. 19 is a circuit diagram of a duplexer in accordance with a fourth embodiment.

FIG. 19 is a circuit diagram of a duplexer in accordance with a fourth embodiment. As illustrated in FIG. 19, a transmit filter 74 is connected between a common terminal Ant and a transmit terminal Tx. A receive filter 76 is connected between the common terminal Ant and a receive terminal Rx. The transmit filter 74 transmits signals in the transmit band to the common terminal Ant as transmission signals among signals input from the transmit terminal Tx, and suppresses signals with other frequencies. The receive filter 76 transmits signals in the receive band to the receive terminal Rx as reception signals among signals input from the common terminal Ant, and suppresses signals with other frequencies. At least one of the transmit filter 74 or the receive filter 76 may be the filter of the third embodiment.

Although the embodiments of the present invention have been described in detail, it is to be understood that the various change, substitutions, and alterations could be made hereto without departing from the spirit and scope of the invention.

What is claimed is:

1. A resonant circuit comprising:
an acoustic wave resonator; and
at least one of a first capacitor connected in series to the acoustic wave resonator and a second capacitor connected in parallel to the acoustic wave resonator,
wherein:
a capacitance of the acoustic wave resonator is to be changed so that a change in input impedance and/or output impedance is reduced when a capacitance of said at least one of the first and second capacitors is changed, and
an amount of change $\Delta C0$ in the capacitance $C0$ of the acoustic wave resonator is given by $(\Delta Cs \times \Delta Cp - C0^2 - \Delta Cp \times C0)/(C0 - \Delta Cs)$, when a capacitance of the first capacitor is changed from Cs to Cs+$\Delta$Cs, and a capacitance of the second capacitor is changed from Cp to Cp+$\Delta$Cp, where Cs and $\Delta$Cs are both zero when the first capacitor is not provided, and Cp and $\Delta$Cp are both zero when the second capacitor is not provided.

2. The resonant circuit according to claim 1, wherein the acoustic wave resonator includes:
a piezoelectric substrate;
a pair of reflectors located on the piezoelectric substrate; and
interdigital transducers located on the piezoelectric substrate between the pair of reflectors and electrically connected in parallel between a first node and a second node,
at least one interdigital transducer of the interdigital transducers is capable of being disconnected from at least one of the first node and the second node.

3. The resonant circuit according to claim 2, further comprising:
a first switch that electrically connects and disconnects the at least one interdigital transducer between the first node and the second node,
wherein the capacitance of the acoustic wave resonator is changed by switching of the first switch.

4. The resonant circuit according to claim 1, wherein
the acoustic wave resonator includes piezoelectric thin film resonators electrically connected in parallel between a first node and a second node, and
at least one piezoelectric thin film resonator of the piezoelectric thin film resonators is capable of being disconnected from at least one of the first node and the second node.

5. The resonant circuit according to claim 1, wherein:
said at least one of the first and second capacitors includes:
a substrate;
a first electrode and a second electrode that are located on the substrate and face each other;
a ferroelectric film that covers the first electrode and the second electrode; and
a voltage application electrode that is located on the ferroelectric film and overlaps with the first electrode and the second electrode in a plan view, and
the capacitance of said at least one of the first and second capacitors is changed by a voltage applied to the voltage application electrode.

6. The resonant circuit according to claim 1, wherein:
said at least one of the first and second capacitors includes:
capacitor elements connected in parallel between a third node and a fourth node; and
second switches each electrically connecting and disconnecting a corresponding capacitor element of the capacitor elements between the third node and the fourth node, and
the capacitance of said at least one of the first and second capacitors is changed by switching of the second switches.

7. The resonant circuit according to claim 1, further comprising:
a controller that changes the capacitance of the acoustic wave resonator so that the change in input impedance and/or output impedance is reduced when the capacitance of at least one of the first and second capacitors is changed.

8. A filter circuit comprising:
a plurality of series resonators connected in series between an input terminal and an output terminal; and
one or more parallel resonators connected in parallel between the input terminal and the output terminal,
wherein:
at least one of the plurality of series resonators includes a resonant circuit that comprises:
a capacitor of which a capacitance is variable; and
an acoustic wave resonator to which the capacitor is connected in parallel, a capacitance of the acoustic wave resonator being to be changed so that a change in input impedance and/or output impedance is reduced when the capacitance of the capacitor is changed,
a series resonator having a lowest antiresonant frequency among the plurality of series resonators includes the resonant circuit, and
at least one of remaining series resonators of the plurality of series resonators does not include the resonant circuit.

9. A filter circuit comprising:
one or more series resonators connected in series between an input terminal and an output terminal; and
a plurality of parallel resonators connected in parallel between the input terminal and the output terminal, wherein:
at least one of the plurality of parallel resonators includes a resonant circuit that comprises:
   a capacitor of which a capacitance is variable; and
   an acoustic wave resonator to which the capacitor is connected in series, a capacitance of the acoustic wave resonator being to be changed so that a change in input impedance and/or output impedance is reduced when the capacitance of the capacitor is changed,
a parallel resonator having a highest resonant frequency among the plurality of parallel resonators includes the resonant circuit, and
at least one of remaining parallel resonators of the plurality of parallel resonators does not include the resonant circuit.

10. An acoustic wave resonator comprising:
a piezoelectric substrate;
a pair of reflectors located on the piezoelectric substrate; and
interdigital transducers that are located on the piezoelectric substrate between the pair of reflectors and electrically connected in parallel between a first terminal and a second terminal,
wherein a switch is to be electrically connected in series between at least one interdigital transducer of the interdigital transducers and the first terminal and/or the second terminal,
wherein the interdigital transducers include a first interdigital transducer to which the switch is not to be connected and a second interdigital transducer that is located between the first interdigital transducer and at least one of the pair of reflectors and to which the switch is to be connected, and
wherein a number of pairs in the second interdigital transducer is less than a number of pairs in the first interdigital transducer.

* * * * *